Dec. 6, 1960 W. R. CASS 2,962,801

METHOD OF MAKING ELECTRIC CIRCUITS

Filed June 14, 1956 2 Sheets-Sheet 1

*Inventor*
W. R. Cass

By *Holcombe, Wetherill & Brisebois*
*Attorney*

Inventor
W. R. Cass
By Holcomb, Wetherill & Brisebois
Attorneys

United States Patent Office 2,962,801

Patented Dec. 6, 1960

2,962,801

METHOD OF MAKING ELECTRIC CIRCUITS

Wilfred Richard Cass, Cambridge, England, assignor to Pye Limited, Cambridge, England, a British company Filed June 14, 1956, Ser. No. 591,373

Claims priority, application Great Britain June 14, 1955

6 Claims. (Cl. 29—155.5)

The present invention relates to electrical circuits and particularly to a method for connecting a circuit component to a so-called printed circuit applied to one face of a chassis that comprises a plate of insulating material.

The invention may be used in the production of printed circuit assemblies and sub-assemblies, for example, for use in all kinds of electronic apparatus such as, for example, radio and television equipment, amplifiers and so on.

The so-called "printed circuits" generally comprise a chassis in the form of a plate of insulating material such as, for example, a phenolic laminate, with a wiring pattern applied by a printing, stencilling or spraying process in copper foil or other conducting metal to one face thereof. It has previously been proposed to connect electrical components to such a chassis by mounting the components on the other face of the chassis, passing their leads through holes in the chassis and the wiring pattern beneath, and dipping the chassis in a bath of molten solder so that only the under face thereof, i.e. the face thereof bearing the wiring pattern touches the surface of the solder. This secures the leads in position and any excess length thereof may be cut off before or after the dipping. Whilst this process is quite satisfactory where the area of the chassis is small, problems arise where the chassis is relatively large in area, i.e. exceeding about 8" x 5", due to the fact that the chassis warps when it comes into contact with the hot surface of the molten solder.

The present invention is more particularly concerned with overcoming this problem.

According to the present invention, there is provided a method for connecting a circuit component to a so-called printed circuit applied to one face of a chassis comprising an insulated base, which includes the steps of forming holes through the said base and through the wiring pattern therebeneath, representing points thereon between which the component is to be connected, applying the component to the upper face of the chassis, passing the component leads through the said holes, curving the chassis in one plane, and moving the chassis, printed circuit lowermost, in an arcuate path approximating to the arc of a circle over the surface of a bath of molten solder, the radius of the arcuate path being substantially equal to the radius of curvature of the chassis, and the underface of the chassis touching the molten solder substantially only along a line transverse to the plane of curvature at any one time during the movement.

In this manner the chassis is moved as though the wiring pattern were at the end of a pendulum of length substantially equal to the radius of curvature of the chassis and as though this pendulum were pivoted so that its tip just touches the surface of the solder.

Before the dipping operation, the component may be temporarily secured in position by bending back the leads thereof at an angle to the direction of the holes through the chassis thereby clenching the leads over the undersurface of the chassis. Any excess metal of the leads may be cut off before or after the dipping operation.

In utilising the invention a large number of components, such as resistances, capacitors and so on may be secured to the chassis whereupon the dipping operation will effectively secure the components at their appropriate places in relation to the wiring pattern on the lower face of the chassis.

In order that the invention may be more clearly understood, reference will now be made to the accompanying drawings which show one embodiment thereof by way of example, and in which.

Figures 1, 2:
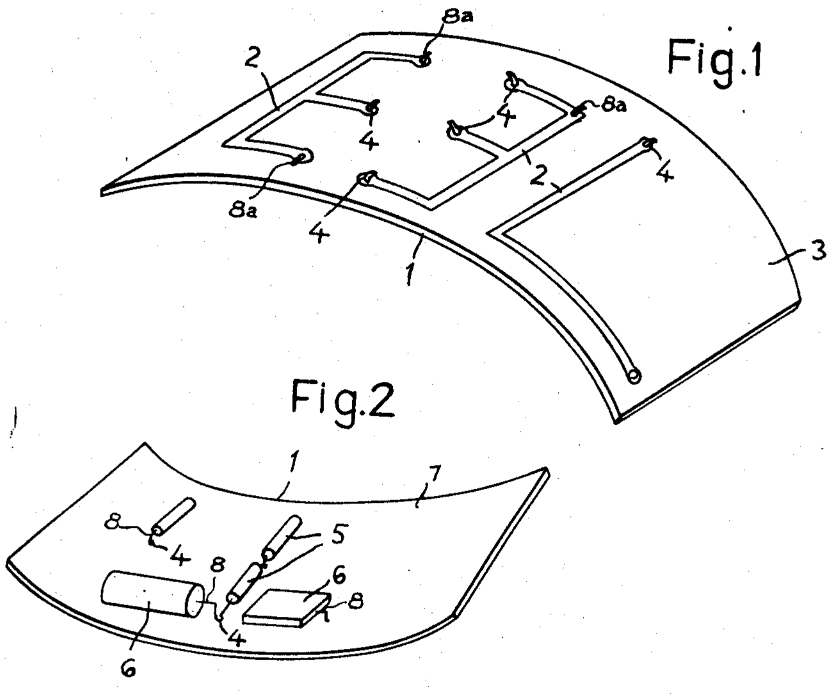
Fig. 1 shows a perspective view of the convex face of a curved chassis.
Fig. 2 shows a perspective view of the concave face of the chassis.

In the drawings, 1 shows a chassis in the form of a plate of phenolic laminate insulating material having a wiring pattern or a so-called "printed circuit" 2 applied to one face 3 thereof by any convenient process known in the art, e.g. by printing, stencilling or spraying copper or other conducting metal. Before or after the application of the printed circuit, the chassis is curved in one plane as shown, the convex surface bearing the printed circuit, see Fig. 1. Holes 4 are formed through the chassis and the printed circuit, representing points on the latter between which components are to be connected. These holes may be formed before the chassis is curved if the printed circuit is applied before curving. Components such as resistors 5 or capacitors 6 are then mounted on the surface 7, their leads 8 being passed through the holes 4 and clenched over at 8*a* to prevent the components from falling out.

Figure 4:
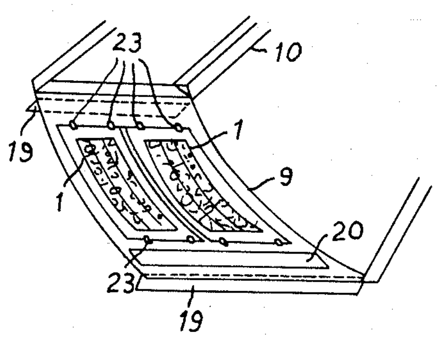
Fig. 4 shows a detail of the apparatus of Fig. 3.
Figure 3:
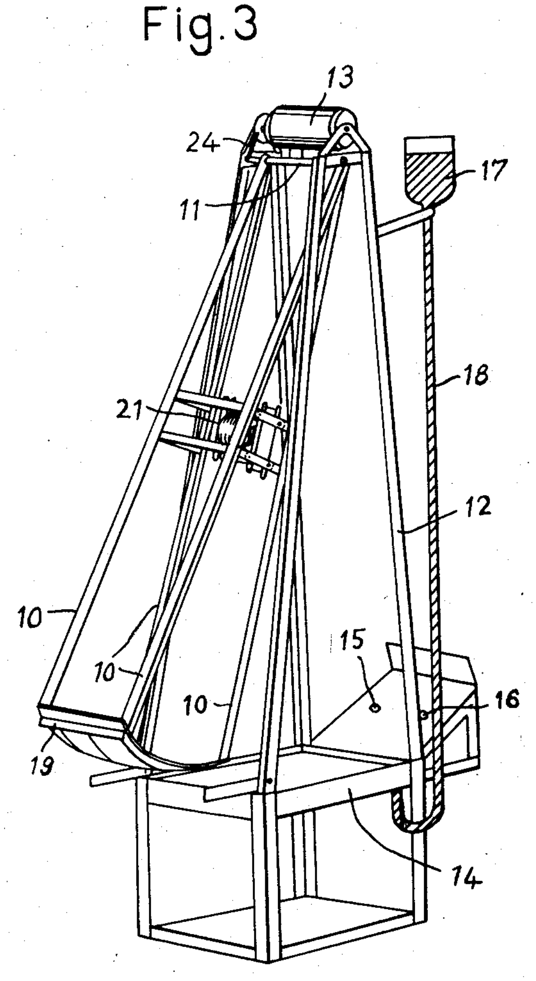
Fig. 3 shows schematically apparatus for moving chassis to touch the surface of a bath of molten solder.

The chassis is then ready for soldering. It is suspended, convex face lowermost as shown in Fig. 3, in a cradle or the like 9 suspended by ties 10 from a bar 11 so as to swing in a framework 12. At the top of the framework a geared-down electric motor 13 is mounted and is connected by a suitable linkage to the bar 11 to cause the framework 12 to swing back and forth. The length of the ties 10 is substantially equal to the radius of curvature of the chassis 1. The cradle 9 is arranged to take the chassis 1 as shown in Fig. 4. A bath 14 to contain molten solder is located on the framework 12 as shown to be beneath the chassis so that the latter just touches the surface of the solder in a line transverse to the plane of the curve. The chassis is swung, pendulum fashion from one side to the other, Fig. 3 showing the apparatus in one end position, so that lines of contact are effected throughout the length of the chassis during its swing. The places desired to be soldered, i.e. the areas around the holes 4, are preferably fluxed at least three muintes before loading the chassis into the cradle and at the end of the swing the chassis are sprayed by a spraying gun (not shown) having two outlet nozzles 15 and 16. The gun is fed with soldering flux from a reservoir 17 mounted at the upper end of the framework 12. After the chassis have passed over the spray gun nozzles, the oscillating cradle forming a pendulum hits a stop. This stop member is not shown in the drawing for the sake of simplicity but it may be a simple hook or the like operated by a detent. The flux gun stops operating and the chassis in their cradle are held stationary for approximately half a minute or a little less while the flux dries. The detent is then released by any suitable means and the pendulum returns on its return path so that the chassis returns through the solder bath to receive a second dip treatment and at the end of the return swing impinges against a suitable stop hook or the like, not shown in the drawings, where it can be held until released for another cycle.

The cradle 9 may comprise an aluminum framework having machined steel face members attached thereto. Fitted to the cradle at each end thereof are stainless steel scraper blades 19 as shown in Figure 4, which depend below the surface of a chassis so as to clean the surface of the solder ahead of the chassis during their travel. A stainless steel flux plate 20 which is located to be in front of the chassis on the first dip movement is painted with soldering flux by means of a roller as the pendulum moves into the loading position.

The solder for feeding to the solder bath is preferably of circular cross-section having a diameter of about 0.125" and is automatically fed into the bath in fixed amounts while the pendulum is stationary at the flux gun position if suitably positioned contacts indicate that the solder surface is below a predetermined level. The resultant tolerance in the level of the solder is about 0.004".

Figure 5:
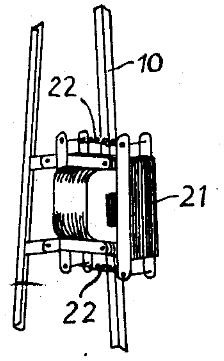
Fig. 5 shows a vibrator as used in Fig. 3, Figs. 4 and 5 being to a larger scale than Fig. 3.

In order to improve the consistency of the soldering coating applied during the dipping strokes, the pendulum is arranged to be vibrated during its travel by means of a vibrator 21, shown more particularly in Figure 5, and comprising a large low frequency choke built on E-shaped laminations located the same way round to form the core, and with its I-shaped laminations held by two springs 22 near the core forming an armature which is vibrated by electrical energy at a frequency of about 50 cycles per second fed to the windings in any conventional manner, which is not represented in the drawings. As can be seen from Figure 3, this vibrator is mounted roughly half way up the pendulum and produces a horizontal vibration.

The overall operational cycle takes about 3 minutes.

Since it is not necessary for the parts of the circuits other than the joints to take up solder, these parts are preferably given a protective coating or a mask so as not to take up solder when the chassis are moved through the bath. The protective coat may be, for example, a layer of shellac.

Alternatively and preferably a removable mask, for example, of stainless steel is applied to the lower face of the chassis and secured in intimate contact therewith by any means found convenient, for example, clamps. This mask is not shown in the drawings but it is believed that its formation and location will be apparent from what has gone before. For example, such a mask could comprise a sheet having cut-out portions to register with the areas around the holes 4, as will be readily appreciated. An important advantage accruing from this is that the somewhat large areas of the conductors of the printed circuit are protected from the heat of the solder and thus there is little, if any, tendency for bubbles produced by included moisture, to form behind them. Therefore, the conductors do not tend to leave the surface of the chassis.

Another advantage of covering the conductors during the contact with the solder is economy. It should be understood, however, that the invention is not limited to a masking process.

Conveniently, the chassis 1 are held in position on the cradle by means of turn buttons 23 or the like.

I claim:

1. A method for connecting a circuit component to a so-called printed circuit applied to one face of a chassis comprising an insulated base, which includes the steps of forming holes through the said base and through the wiring pattern therebeneath, representing points thereon between which the component is to be connected, applying the component to the upper face of the chassis, passing the component leads through the said holes, curving the chassis in one plane, thus forming a concave surface and a convex surface, the convex surface supporting said printed circuit, and moving the chassis, with said convex surface and printed circuit lowermost, in an arcuate path approximating to the arc of a circle over the surface of a bath of molten solder, the radius of the arcuate path being substantially equal to the radius of curvature of the chassis, and the underface of the chassis touching the molten solder substantially only along a line transverse to the plane of curvature at any one time during the movement.

2. A method as claimed in claim 1, in which before the dipping operation the component is temporarily secured in position by bending back the leads thereof at an angle to the direction of the holes through the chassis thereby clenching the leads over the convex surface of the chassis that supports the printed circuit.

3. A method of applying solder to a printed circuit that is applied to one face of a chassis comprising an insulated base, with holes formed through said base and printed circuit, said method comprising curving said chassis in one plane, thus forming a concave surface and a convex surface, the convex surface supporting said printed circuit and moving the chassis, with said convex surface and printed circuit together with any component leads that have been passed through said holes from the said insulated concave surface lowermost, in an arcuate path approximating to the arc of a circle over the surface of a bath of molten solder, the radius of the arcuate path being substantially equal to the radius of curvature of the chassis, and the underface of said chassis touching the molten solder substantially only along a line transverse to the plane of curvature at any one time during the movement.

4. A method of applying solder to a printed circuit that is applied to one face of a chassis comprising an insulated base, with holes formed through said base and printed circuit, said method comprising curving said chassis in one plane, thus forming a concave surface and a convex surface, the convex surface supporting said printed circuit moving the chassis, with said convex surface and printed circuit together with any component leads that have been passed through said holes from the said insulated concave surface lowermost, in an arcuate path approximating to the arc of a circle over the surface of a bath of molten solder, the radius of the arcuate path being substantially equal to the radius of curvature of the chassis and the underface of said chassis touching the molten solder substantially only along a line transverse to the plane of curvature at any one time during the movement, and vibrating said chassis during said arcuate movement in a direction substantially at right angles to the direction of said movement.

5. A method for connecting a circuit component to a so-called printed circuit applied to one face of a chassis comprising an insulated base, which includes the steps of forming holes through the said base and through the wiring pattern therebeneath, representing points thereon between which the component is to be connected, applying the component to the upper face of said chassis passing the component leads through said holes, curving the chassis in one plane, thus forming a concave surface and a convex surface, the convex surface supporting said printed circuit, moving the chassis with said convex surface and, printed circuit lowermost, in an arcuate path approximating to the arc of a circle over the surface of a bath of molten solder, the radius of the arcuate path being substantially equal to the radius of curvature of the chassis and the underface of the chassis touching the molten solder substantially only along a line transverse to the plane of curvature at any one time during a movement, and vibrating said chassis during said movement in an arcuate path.

6. A method for connecting a circuit component to a so-called printed circlit applied to one face of a chassis comprising an insulated base, which includes the steps of forming holes through the said base and through the wiring pattern therebeneath, representing points thereon between which the component is to be connected, applying the component to the upper face of the chassis, passing the component leads through said holes, curving the chassis in one plane, thus forming a concave surface and a convex surface, the convex surface supporting said printed circuit, fluxing the said printed circuit and the component leads, moving the chassis with said convex surface and, printed circuit lowermost, in an arcuate path approximating to the arc of a circle over the surface of a bath of molten solder, the radius of the arcuate path being substantially equal to the radius of curvature of the chassis, and the underface of the chassis touching the molten solder substantially only along a line transverse to the plane of curvature at any one time during the said arcuate movement, scraping the surface of the molten solder in the path of movement of the said chassis so as to present an unadulterated surface of molten solder to said chassis, and vibrating said chassis during said arcuate movement in a direction substantially at right angles to the direction of said movement.

References Cited in the file of this patent

UNITED STATES PATENTS

| | | |
|---|---|---|
| 1,292,909 | Spery | Jan. 28, 1919 |
| 1,910,687 | Freeburg | May 23, 1933 |
| 2,264,703 | Lenz | Dec. 2, 1941 |
| 2,671,264 | Pessel | Mar. 9, 1954 |
| 2,756,485 | Abramson et al. | July 31, 1956 |
| 2,757,443 | Steigerwalt et al. | Aug. 7, 1956 |
| 2,771,852 | Iles | Nov. 26, 1956 |